United States Patent [19]

Napp et al.

[11] Patent Number: 4,836,435
[45] Date of Patent: Jun. 6, 1989

[54] COMPONENT SELF ALIGNMENT

[75] Inventors: Duane T. Napp; Kevin J. Roche, both of Austin, Tex.

[73] Assignee: International Business Machines Corporation, Armonk, N.Y.

[21] Appl. No.: 205,007

[22] Filed: Jun. 6, 1988

Related U.S. Application Data

[63] Continuation of Ser. No. 861,815, May 12, 1986, abandoned.

[51] Int. Cl.⁴ .............................................. B23K 19/00
[52] U.S. Cl. .................................................. 228/180.2
[58] Field of Search ........................ 228/180.1, 180.2; 357/69; 361/403, 406, 409, 411

[56] References Cited

U.S. PATENT DOCUMENTS

| | | | |
|---|---|---|---|
| 3,778,530 | 12/1973 | Reimann | 228/180.2 |
| 3,887,760 | 6/1975 | Krieger | 228/180.2 |
| 4,494,688 | 1/1985 | Hatada | 228/180.2 |
| 4,515,304 | 5/1985 | Berger | 228/180.1 |
| 4,600,137 | 7/1986 | Comerford | 228/180.2 |
| 4,605,153 | 8/1986 | Van Den Brekel | 228/180.2 |

Primary Examiner—Kurt Rowan
Attorney, Agent, or Firm—Andrea P. Bryant

[57] ABSTRACT

Alignment of leaded surface mount components to solder pads is enhanced by providing at least two soldered areas per lead, separated by a space of non-wettable material so that during component placement on the soldered areas there is a tendency for the components to self center as the leads fall between the raised soldered areas where they are retained during a reflow operation.

4 Claims, 2 Drawing Sheets

COMPONENT SELF ALIGNMENT

This is a continuation of application Ser. No. 861,815 filed May 12, 1986, abandoned.

DESCRIPTION

1. Technical Field

The present invention relates to the design of solder pads on printed circuit boards. More specifically it relates to an improvement in self alignment characteristics of surface mountable components as a result of a particular solder pad geometry.

2. Background Art

The electronic industry is moving rapidly from pin in hole component attachment techniques to printed circuit boards to surface connection techniques which are significantly different. Pin in hole components are inserted into holes in the printed circuit boards and the leads are clinched to temporarily hold the components during subsequent flux and solder operations.

Two processes are most frequently used in the industry for attaching surface mountable components to printed circuit boards. In the first technique solder paste or creams are applied to the printed circuit boards using stencils or screens. The paste is dried until tacky. Components are placed on the tacky solder paste and the reflow operation occurs in a vapor phase or infrared reflow machine. Using stencils and screens requires new artwork unique to each board configuration. This requirement is costly, time consuming and messy.

The other process includes mounting the components to the printed circuit board with adhesives then passing the assembled board over a wave of solder. Numerous problems such as solder bridges, non-wet areas, adhesive stringers, and frequency of rework requirements are inherent in this process.

U.S. Pat. No. 4,515,304 to Buger exemplifies the direction taken in the industry. This reference teaches mounting of leaded components and surface mountable components on opposite sides of the same printed circuit board. It teaches a multi-step process including inserting the leaded components crimping their ends, turning the board over and applying solder paste using individual applicator nozzles to the ends of the leads and to solder pads on the circuit pattern. Surface mountable components are positioned with their contact areas aligned with the solder pads and the whole reflow soldered.

DISCLOSURE OF THE INVENTION

The present invention provides a technique using a wave solder method for applying solder to printed circuit board pads to which electronic components will be mounted. The quantity of solder applied to the solder pad is controlled by means of the geometry of the planar solder pad. The geometry of the planar solder pad not only controls the amount of solder adhering thereto, it also provides a self alignment capability for the components thereby increasing the reliability of the electrical connections and process yield.

The width of the solder pad is divided into several sections, alternate ones of which are metalized. When the card is processed over a solder wave, solder is deposited only on the metalized areas. The solder configuration is dome like. The presence of domes on the alternate areas of each solder pad causes a component placed thereon to self center due to the configuration of its leads.

Solder pads may be divided in the x or y direction. The x direction pads allow the component to float in the y direction, but centers it in the x direction while the y direction pads center the component in the y direction allowing the component to float in the x direction. Best fit of all component leads to the pads is obtained during solder reflow.

BRIEF DESCRIPTION OF THE DRAWING

The above and other features and advantages of the present invention will become apparent during the following detailed description in connection with the accompanying drawing wherein.

BEST MODE FOR CARRYING OUT THE INVENTION

Figure 1:
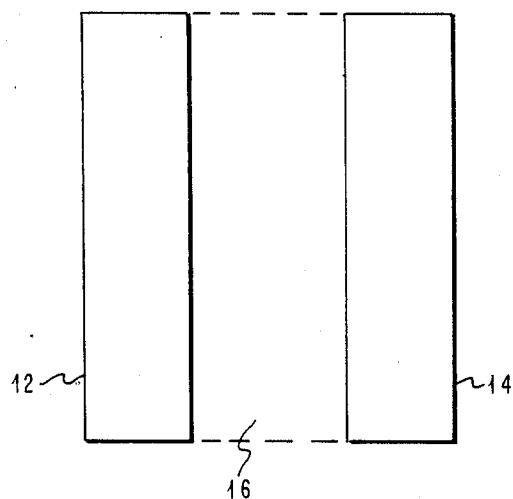
FIG. 1 is a planar view of a solder pad divided in accordance with the invention.

FIG. 1 shows, not to scale, a schematic representation of a solder pad 10 on the surface of a printed circuit substrate. Solder pad 10 is generally rectangular. In accordance with the invention, pad 10 is divided into three areas, 12 and 14 are metalized areas to which solder will be applied. The area 16 between portions 12 and 14 is not metalized and is not solder wettable.

Figure 2:
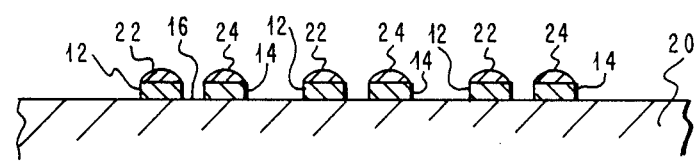
FIG. 2 is a cross-sectional view of a solder pad with solder applied.
Figure 3:
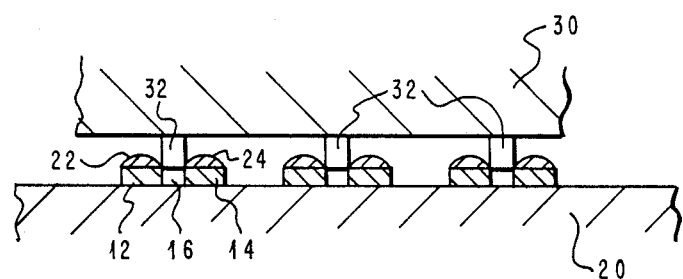
FIG. 3 illustrates the position of component leads relative to the soldered pads.

In FIGS. 2 and 3, the areas 12, 14 and 16 are also shown in cross-section. Referring specifically to FIG. 2, a portion of a printed circuit substrate 20 is shown with metalized solder pad areas 12 and 14 for three solder pads. Each metalized pad area 12 and 14 has solder applied thereto. Due to the physical properties of solder applied through wave soldering, domed solder areas 22 and 24 are formed.

FIG. 3 schematically represents in cross-section the printed circuit substrate 20 with solder pads 22 and 24 and a component 30 with leads 32 which may be round, gullwing, J-lead, etc. located so that each lead 32 fits between a set of solder domes 22 and 24. It will be appreciated that as component 30 is lowered toward circuit substrate 20, leads 32, if not exactly centered between solder domes 22 and 24, will by virtue of the geometry of domes and leads tend to self center between domes 22 and 24.

Refer back to FIG. 1. The total width of the usual solder pad falls in the range from about 24 to 34 mils. It has been found that dividing it into three sections 12, 14, and 16 as shown in FIG. 1 is preferably. Only sections 12 and 14 which have a width in a range from about 9 to 15 mils are metalized, typically copper plated, and section 16 between metalized pad areas 12 and 14 is generally in the range of about 4 to 6 mils wide and is not metalized. Section 16 may typically be glass epoxy. When a printed circuit card having such pad configurations is passed over a solder wave, solder is deposited of course only on metalized areas 12 and 14 and the cross-section of the soldered pads has the configuration shown in FIGS. 2 and 3.

Figure 4:
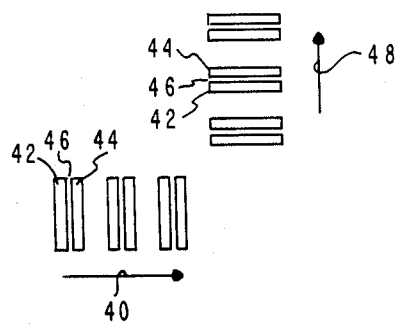
FIG. 4 illustrates a plurality of solder pads divided in accordance with the invention in both the x and y directions.

Refer now to FIG. 4. A corner section of a generally rectangular land pattern on a printed circuit substrate is shown. Arrow 40 represents the x direction and arrow 48 represents the y direction. Two sets of three solder pads are represented, only two of which have reference numerals. Areas 42 and 44 represent the metalized portions of the solder pad (compare to 12 and 14, FIG. 1). An area 46 represents the non-metalized area equivalent to section 16 in FIG. 1. The three pads in the y direction shown by arrow 48 are similarly indicated.

It will be appreciated by those skilled in the art that arranging the metalization pattern to have the metalized areas with their lengthwise dimension generally perpendicular to the x or y direction of the surface of the circuit substrate allows an enhancement to the component self centering effect already described. During the solder reflow step of the entire component attach process the x direction pads, indicated as those perpendicular to arrow 40, allow the component to "float" in the y direction, but the component centers itself in the x direction. Similarly, the y direction pads, those perpendicular to arrow 48, allow the component leads to "float" in the x direction while centering in the y direction. The best fit of all component leads to the pads is obtained during the reflow phase of the operation.

The advantage of the self centering property of components mounted to pads metalized in accordance with the present invention may be appreciated with the improved reliability of the solder joints and the reduction in rework requirements. All leads have a maximum area of contact with the solder pads, and the accuracy of component placement enhanced by the self centering property decreases rework steps. Further advantages accrue from the lessening of assembly costs due to the elimination of the materials and apparatus associated with the application of solder paste, generation of the artwork, and manufacture of stencils.

Figure 5:
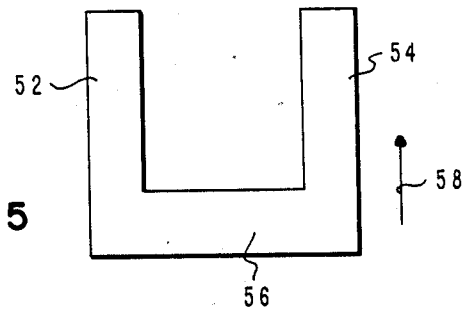
FIGS. 5, 6 and 7 illustrate alternative planar pad geometry embodiments.
Figure 6:
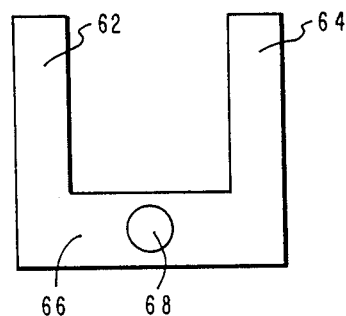
Figure 7:
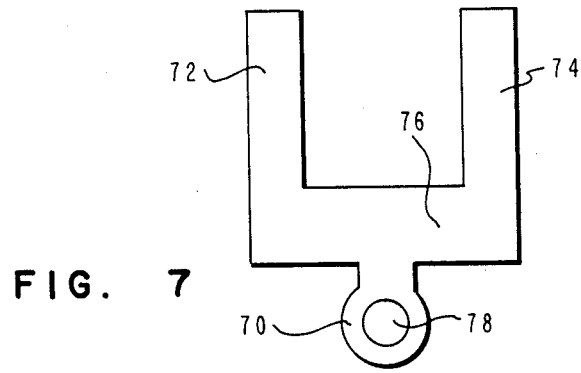

FIGS. 5, 6 and 7 represent alternative planar pad geometries which have been found to display the same advantageous component self centering features. In FIG. 5 the pad is metalized in a generally U-shaped configuration with upright arms 52, 54 and base 56 serving to capture and hold the component lead.

While the several figures represent only the planar dimensions (parallel to the circuit substrate surface), it will be understood that, as represented in FIGS. 2 and 3, a certain thickness of solder pad is present. The required thickness is a function of the length of the component leads. A metalized layer having a thickness in the range of about 6 mils greater than the length of the component leads has been found to be particularly effective. As is true of portions 12 and 14 in FIG. 1, as well, upright arms 52 and 54 have been found to be most effective when their width is substantially equal to a value no greater than ½ the width of the component lead minus 2 mils. The non-metalized area between upright arms 52 and 54 is chosen in a manner similar to the width of the area 16 in FIG. 1, as is, advantageously, in the range between 4 mils and up to ½ the component lead width.

FIG. 6 represents another satisfactory metalization pattern in which the areas represented by 62, 64 and 66 are equivalent to 52, 54, and 56 in FIG. 5. A through hole 68, however, is added in the base of the U-shaped 66 in FIG. 6. This through hole provides an electrical access means from the opposite surface of the printed circuit substrate so that test readings may be obtained as desired. In addition this through hole can be used for z-axis escape for the wiring of the printed circuit board.

FIG. 7 differs from FIG. 6 in the overall configuration by having an area 70 extending from the general U-shaped portion in which section 72, 74, and 76 are equivalent to sections 62, 64 and 66 discussed with reference to FIG. 6. Metalized extension area 70 may also include a through hole 78. The dimensions for extension 70 and hole 78 are not critical as they are provided for electrical access, both from the surface on which the metalized solder pad is located and from the rear or opposite side of the printed circuit substrate. Although the size and exact shape of the test pad 70 and through hole 78 do not affect the self centering feature of the generally U-shaped portion 72, 74, 76 of the solder pad in cooperation with component leads, the dimensions of the extension 70 and hole 78 are, of course, limited by process parameters used in the manufacture of the printed circuit substrate as well as the parameters of the test apparatus contemplated for use therewith.

While the invention has been shown and described having reference to particular embodiments and modifications thereto, and with particular dimensional ranges stated, it will be understood by those skilled in the art that changes in form and dimensional detail may be made without departing from the spirit and scope of the invention.

What is claimed is:

1. An improved method of attaching leaded components to surface solder pads defining generally rectangular areas on an insulating substrate for printed circuitry comprising:
   dividing each solder pad surface area on the substrate surface into three sections;
   metalizing non-adjacent ones of said sections so as to provide two metalized sections per lead;
   depositing solder only on the metalized solder pad sections;
   placing components so that each of their leads is between and touching metalized sections on a solder pad; and
   reflowing the solder.

2. The method of claim 1 wherein the metalizing step includes plating with copper.

3. A method of improving leaded surface mountable component self alignment to solder pads, located at areas having a generally rectangular shape on an external insulating surface of a printed circuit substrate comprising:
   metalizing only non adjacent sections of the solder pad areas for providing two metalized sections per solder pad per component lead;
   separating the two metalized sections by a planar non metalized section narrower than a surface mountable component lead, of the insulating surface of the printed circuit substrate;
   depositing solder on the metalized sections by passing the printed circuit substrate over a solder wave; and
   locating components over the solder pad areas so that each lead rests touchingly between two metalized sections of a solder pad.

4. The method of claim 1 wherein the depositing step includes passing the solder pads over a solder wave.

* * * * *